(12) United States Patent
Lim (10) Patent No.: US 10,993,311 B2
(45) Date of Patent: Apr. 27, 2021

(54) DISPLAY DEVICE

(71) Applicant: Samsung Display Co., Ltd., Yongin-si (KR)

(72) Inventor: Cheoloh Lim, Asan-si (KR)

(73) Assignee: Samsung Display Co., Ltd., Yongin-si (KR)

(*) Notice: Subject to any disclaimer, the term of this patent is extended or adjusted under 35 U.S.C. 154(b) by 76 days.

(21) Appl. No.: 16/539,924

(22) Filed: Aug. 13, 2019

(65) Prior Publication Data

US 2020/0137881 A1 Apr. 30, 2020

(30) Foreign Application Priority Data

Oct. 24, 2018 (KR) .......................... 10-2018-0127111

(51) Int. Cl.
*H05K 1/02* (2006.01)
*H05K 5/00* (2006.01)
*H05K 1/14* (2006.01)

(52) U.S. Cl.
CPC ........... *H05K 1/0218* (2013.01); *H05K 1/147* (2013.01); *H05K 5/0017* (2013.01)

(58) Field of Classification Search
None
See application file for complete search history.

(56) References Cited

U.S. PATENT DOCUMENTS

| | | | |
|---|---|---|---|
| 9,772,520 B2 * | 9/2017 | Kuo | G02F 1/13338 |
| 2009/0284946 A1 * | 11/2009 | Yang | H05K 9/0054 |
| | | | 361/818 |
| 2014/0267683 A1 * | 9/2014 | Bibl | G09G 3/006 |
| | | | 348/87 |
| 2017/0088749 A1 * | 3/2017 | Tsuchida | G09F 9/00 |
| 2018/0088387 A1 * | 3/2018 | Enami | H05K 1/118 |
| 2019/0064562 A1 * | 2/2019 | Nakui | G02F 1/136286 |
| 2019/0174620 A1 * | 6/2019 | Fang | H05K 3/06 |
| 2019/0197932 A1 * | 6/2019 | Asatani | G06F 3/044 |
| 2019/0304921 A1 * | 10/2019 | Kuroe | H01L 27/1244 |
| 2019/0369832 A1 * | 12/2019 | Sakaue | H05K 1/0259 |

FOREIGN PATENT DOCUMENTS

| | | |
|---|---|---|
| KR | 10-0959128 B1 | 5/2010 |
| KR | 10-1175563 B1 | 8/2012 |
| KR | 10-1232571 B1 | 2/2013 |
| KR | 10-1340296 B1 | 12/2013 |
| KR | 10-2018-0068357 A | 6/2018 |

* cited by examiner

*Primary Examiner* — Xanthia C Cunningham
(74) *Attorney, Agent, or Firm* — Lewis Roca Rothgerber Christie LLP

(57) ABSTRACT

A display device is capable of preventing electro-static discharge by attaching a driving integrated circuit cover to a driving integrated circuit and a flexible printed circuit board, the display device including a display panel including a display area and a non-display area, a driving integrated circuit for providing signals, data, and voltages to the display area, a flexible printed circuit board coupled to the driving integrated circuit, and including an open ground portion at one side of the flexible printed circuit board, and an integrated circuit cover portion overlapping the driving integrated circuit and at least a portion of the flexible printed circuit board, and including a cut portion at an area corresponding to the open ground portion.

25 Claims, 8 Drawing Sheets

DISPLAY DEVICE

CROSS-REFERENCE TO RELATED APPLICATION

This application claims priority to, and the benefit of, Korean Patent Application No. 10-2018-0127111, filed on Oct. 24, 2018, in the Korean Intellectual Property Office (KIPO), the disclosure of which is incorporated by reference herein in its entirety.

BACKGROUND

1. Field

Embodiments of the present disclosure relate to a display device capable of preventing electro-static discharge ("ESD") of a driving integrated circuit ("IC") by attaching an IC cover to a flexible printed circuit board ("FPCB") connected to the driving IC.

2. Discussion of Related Art

Generally, a display device includes a display panel and a gate driver, and the display panel includes a display area and a non-display area.

The display area includes a plurality of data lines, a plurality of gate lines, and a plurality of pixels. The plurality of pixels are formed at crossing regions of the data lines and the gate lines, and receive data voltages of the data lines when gate signals are applied to the gate lines. The pixels emit light (e.g., at a predetermined brightness) according to the data voltages.

The non-display area is formed around the display area and includes a pad area. A pad portion is provided at the pad area. The pad portion is connected to the plurality of gate lines and data lines of the display area, and is electrically connected to a driving integrated circuit ("IC") and a flexible printed circuit board ("FPCB").

The driving IC and the FPCB may be attached to the non-display area of the display panel by using an anisotropic conductive film, whereby the driving IC may be connected to the gate lines. The FPCB has an open area that serves the grounding function, and the open area has a stepped structure in which a cover layer is cut.

Meanwhile, an IC cover is attached above the driving IC to prevent electro-static discharge ("ESD") after a film-on-glass ("FOG") manufacturing process. The IC cover has a contact area corresponding to the open area of the FPCB, and the contact area may overlap and electrically contact the open area when the IC cover is attached to the FPCB and the driving IC.

However, when the IC cover is attached to the driving IC and the FPCB, there may be an issue that the contact is not made due to the stepped structure of the open area of the FPCB. That is, when the open area of the FPCB is narrow, the contact area of the IC cover might not be brought into contact with the open area, and may be detached therefrom.

Accordingly, in some models, a conductive tape having an adhesive property may be additionally provided to the open area for complete contact, but the cost associated with the addition of the conductive tape may increase.

It is to be understood that this background of the technology section is intended to provide useful background for understanding the technology, and as such, the technology background section disclosed herein may include ideas, concepts, or recognitions that were not part of what was known or appreciated by those skilled in the pertinent art prior to a corresponding effective filing date of subject matter disclosed herein.

SUMMARY

Embodiments of the present disclosure may be directed to a display device capable of preventing electro-static discharge ("ESD") of a driving integrated circuit ("IC"), which provides signals, data, and voltages to a display area of a display panel, by attaching an IC cover to the driving IC, and may be directed to a flexible printed circuit board ("FPCB") connected to the driving IC.

According to an embodiment, a display device includes a display panel including a display area and a non-display area, a driving integrated circuit for providing signals, data, and voltages to the display area, a flexible printed circuit board coupled to the driving integrated circuit, and including an open ground portion at one side of the flexible printed circuit board, and an integrated circuit cover portion overlapping the driving integrated circuit and at least a portion of the flexible printed circuit board, and including a cut portion at an area corresponding to the open ground portion.

The cut portion may include at least two attachment pieces that define a slit or opening.

At least one of the attachment pieces may be bent and may contact the open ground portion.

The display device may further include an adhesive resin between at least one of the attachment pieces and the open ground portion.

The slit or opening may expose a portion of the open ground portion in a plan view.

The slit or opening may have a different width in a plan view according to a relation to a position of at least one of the attachment pieces.

The slit or opening may have a greater width toward a center portion of the open ground portion in a plan view.

At least one of the attachment pieces may have a pointed end.

The slit or opening may have an X-like shape or a cross-shape.

The slit or opening may extend substantially parallel to one side of the cut portion.

The slit or opening may include a first slit or opening, and a second slit or opening that is parallel to the first slit or opening.

The slit or opening may extend in a diagonal direction of the cut portion.

The integrated circuit cover portion might not overlap elements at the flexible printed circuit board.

The integrated circuit cover portion may overlap elements at the flexible printed circuit board.

The display device may further include a non-conductive tape between the integrated circuit cover portion and the driving integrated circuit.

The non-conductive tape may include an adhesive resin at opposite sides thereof.

The driving integrated circuit may be at the non-display area of the display panel.

According to another embodiment, a display device includes a display panel including a display area and a non-display area, a driving integrated circuit for providing signals, data, and voltages to the display area, a flexible printed circuit board including a plurality of wiring layers that are coupled to the driving integrated circuit, and a cover layer that at least partially covers the plurality of wiring layers, and that defines a plurality of opening depressions exposing at least a portion of the plurality of wiring layers, at least one of the plurality of opening depressions including an open ground portion, and an integrated circuit cover portion overlapping the driving integrated circuit and at least a portion of the flexible printed circuit board, and including a cut portion that is at an area corresponding to the open ground portion and that defines at least one slit or opening.

The cut portion may include an attachment piece that is bent at the cover layer and that contacts the open ground portion.

The display device may further include an adhesive resin between the attachment piece and the open ground portion.

The slit or opening may have a different width according to a relation to a position of the attachment piece.

The slit or opening may have a greater width toward a center portion of the open ground portion.

The slit or opening may expose a portion of the open ground portion of the flexible printed circuit board.

The display device may further include a non-conductive tape between the integrated circuit cover portion and the driving integrated circuit.

The flexible printed circuit board may include an element at another of the plurality of opening depressions.

The foregoing is illustrative only, and is not intended to be in any way limiting. In addition to the illustrative aspects and embodiments described above, further embodiments and aspects will become apparent by reference to the drawings and the following detailed description.

BRIEF DESCRIPTION OF THE DRAWINGS

A more complete appreciation of embodiments of the present disclosure will become more apparent by describing in detail embodiments thereof with reference to the accompanying drawings, wherein.

DETAILED DESCRIPTION

Features of the inventive concept and methods of accomplishing the same may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects and features of the present inventive concept to those skilled in the art. Accordingly, processes, elements, and techniques that are not necessary to those having ordinary skill in the art for a complete understanding of the aspects and features of the present inventive concept may not be described. Unless otherwise noted, like reference numerals denote like elements throughout the attached drawings and the written description, and thus, descriptions thereof will not be repeated. Further, parts not related to the description of the embodiments might not be shown to make the description clear. In the drawings, the relative sizes of elements, layers, and regions may be exaggerated for clarity.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

It will be understood that when an element, layer, region, or component is referred to as being "on," "connected to," or "coupled to" another element, layer, region, or component, it can be directly on, connected to, or coupled to the other element, layer, region, or component, or one or more intervening elements, layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

When a certain embodiment may be implemented differently, a specific process order may be performed differently from the described order. For example, two consecutively described processes may be performed substantially at the same time or performed in an order opposite to the described order.

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the embodiments of the present disclosure.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Hereinafter, an embodiment will be described with reference to FIGS. 1 to 11.

Figure 1:
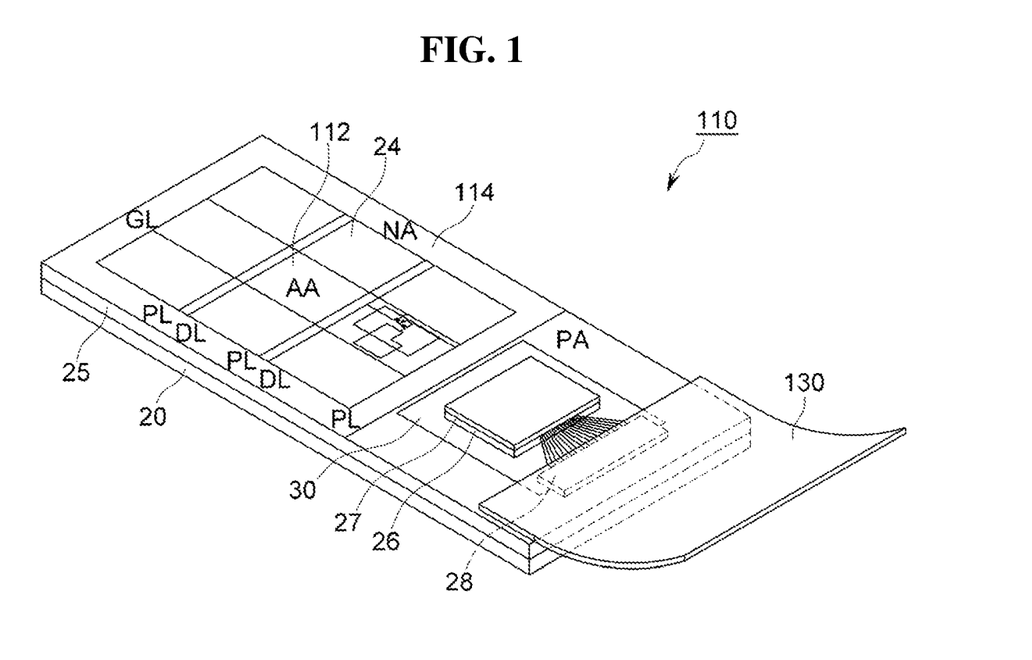
FIG. 1 is a view illustrating a structure of a display panel of a display device according to an embodiment.
Figure 2:
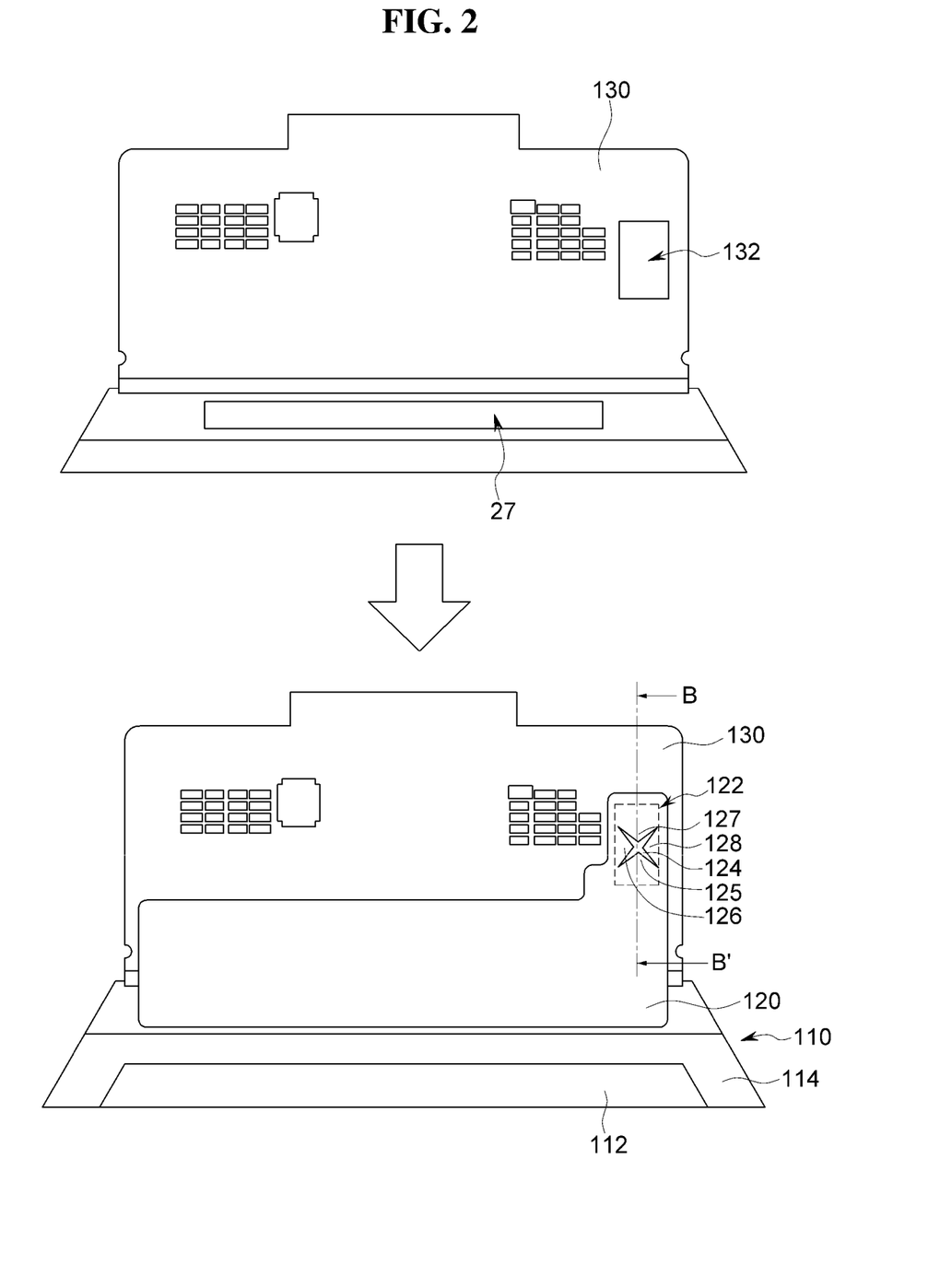
FIG. 2 is a view illustrating an embodiment in which an integrated circuit ("IC") cover portion is attached to a driving IC and a flexible printed circuit board ("FPCB")
Figure 3:
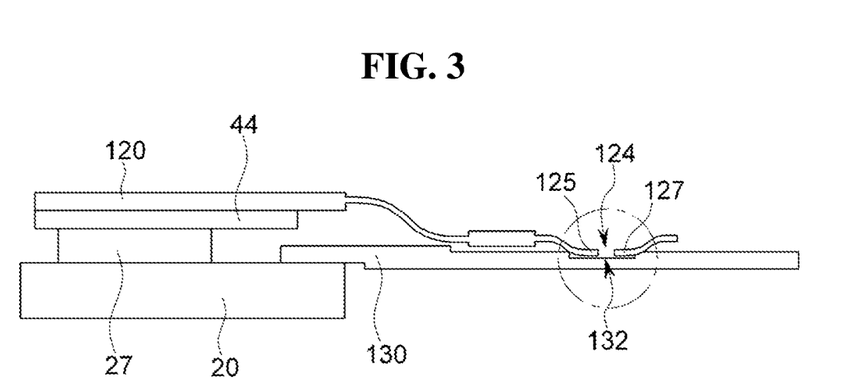
FIG. 3 is a cross-sectional view illustrating a structure in which an IC cover portion according to an embodiment is attached to a driving IC and an FPCB.
Figure 4:
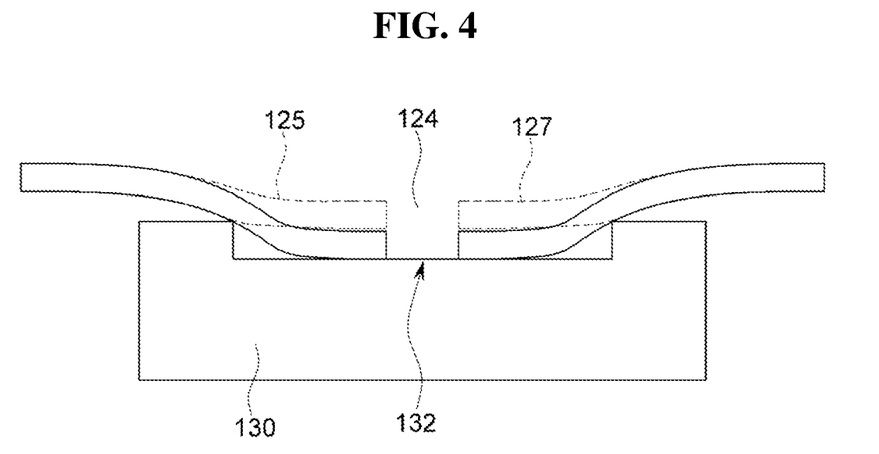
FIG. 4 is a view illustrating an embodiment in which an attachment piece of an IC cover portion is attached to an open ground portion of an FPCB.

FIG. 1 is a view illustrating a structure of a display panel of a display device according to an embodiment, FIG. 2 is a view illustrating an embodiment in which an integrated circuit ("IC") cover portion is attached to a driving IC and a flexible printed circuit board ("FPCB"), FIG. 3 is a cross-sectional view illustrating a structure in which an IC cover portion according to an embodiment is attached to a driving IC and an FPCB, and FIG. 4 is a view illustrating an embodiment in which an attachment piece of an IC cover portion is attached to an open ground portion of an FPCB.

Referring to FIGS. 1 to 4, a display panel 110 of a display device to which embodiments of the present disclosure is applied may include a display area (AA) 112 and a non-display area (NA) 114.

That is, the display panel 110 may include a display area 112 at which an encapsulating protective film 25 is attached on a first substrate 20 and at which images are displayed on the encapsulating protective film 25, and a non-display area 114 other than the display area 112.

The first substrate 20 may include low temperature polysilicon ("LTPS"), and the encapsulating protective film 25 seals a light emitting portion 24 at which an organic light emitting layer is formed, thus substantially preventing moisture and oxygen from penetrating.

In the display area 112, the light emitting portion 24 is provided, and pixels are defined by respective crossing regions of gate lines GL, data lines DL, and power lines PL.

A pad portion 30 is provided at a pad area PA of the non-display area 114. The pad portion 30 is connected to the plurality of gate lines GL and data lines DL of the display area 112, and is electrically connected to the driving IC 27 and the FPCB 130.

The driving IC 27 and the FPCB 130 are located above the encapsulating protective film 25, and are electrically connected to the pad portion 30 during a pressure bonding process using anisotropic conductive films 26 and 28.

Referring to FIG. 2, the driving IC 27 may apply signals, data, and voltages to the display area 112, and may be located at the non-display area 114 of the display panel 110.

The FPCB 130 is electrically connected to the driving IC 27. The FPCB 130 may have, on one side thereof, an open ground portion 132 as an open area that serves a grounding function. The open ground portion 132 is a structure located at an open area of the FPCB 130 to prevent electro-static discharge ("ESD") of the driving IC 27 in a state where the IC cover portion 120 is attached to the FPCB 130. The open ground portion 132 may have a depression in a stepped shape on one side of the FPCB 130. One or more circuit elements 60 may be located on another side of the FPCB 130 (e.g., see FIG. 11).

The IC cover portion 120 may overlap the driving IC 27 and at least a portion of the FPCB 130, and may include a cut portion 122 that is located at an area corresponding to the open ground portion 132.

The cut portion 122 may include at least two attachment pieces (e.g., attachment pieces 125, 126, 127, and 128) and may have a slit (e.g., an opening) 124 defined by the at least two attachment pieces 125, 126, 127, and 128. That is, it may be understood that the cut portion 122 is cut in a horizontal direction, a vertical direction, or a diagonal direction, thus generating the slit 124, and the slit 124 may divide the at least two attachment pieces (e.g., may divide each of the attachment pieces 125, 126, 127, and 128). Accordingly, shapes and sizes of the attachment pieces 125, 126, 127, and 128 may be determined based on the slit 124. As used herein, the attachment pieces 125, 126, 127, and 128 are referred to in the sense that they are pieces divided by the slit 124 and attached to the open ground portion 132 of the FPCB 130. At least one of the attachment pieces 125, 126, 127, and 128 may be bent and may contact the open ground portion 132.

The IC cover portion 120, as illustrated in FIG. 2, may be attached to the driving IC 27 and the FPCB 130 so as to cover the driving IC 27 (e.g., to make the driving IC 27 not visible to a user), and to cover a portion of the FPCB 130 without overlapping circuit elements located at the FPCB 130.

Alternatively, the IC cover portion 120 may be attached to the driving IC 27 and the FPCB 130 so as to cover the driving IC 27 and the FPCB 130, and may overlap circuit elements located at the FPCB 130 to prevent them from being seen.

The IC cover portion 120 may include a metallic material (e.g., Cu), which may be not restored to its original state when bent.

Referring to FIG. 3, the driving IC 27 and the FPCB 130 may be attached on the first substrate 20, which may include LTPS (e.g., with a predetermined clearance). In such an embodiment, an adhesive resin may be provided between the driving IC 27 and the first substrate 20, and an adhesive resin may be provided between the FPCB 130 and the first substrate 20.

When the IC cover portion 120 is attached on the driving IC 27 and the FPCB 130, a non-conductive tape 44 may be provided for insulation between the IC cover portion 120 and the driving IC 27. The non-conductive tape 44 may include an adhesive resin on opposite sides thereof for attachment.

The cut portion 122 of the IC cover portion 120 may be attached to the open ground portion 132 of the corresponding FPCB 130, which corresponds to the cut portion 122. In such an embodiment, at least one of the attachment pieces 125, 126, 127, and 128 may be bent and may contact the open ground portion 132 to be attached thereto. An adhesive resin may be further provided between the at least one of the attachment pieces 125, 126, 127, and 128 and the open ground portion 132 for attachment.

Referring to FIG. 4, the open ground portion 132 may have a depression (e.g., a notch) in a stepped shape on one side of the FPCB 130 that includes a metal material (e.g., Cu).

Accordingly, when the cut portion 122 corresponding to a contact area of the IC cover portion 120 is attached to the FPCB 130, the attachment pieces 125, 126, 127, and 128 may be bent along the stepped shape of the open ground portion 132, and may be attached to a bottom portion of the open ground portion 132 in contact with the bottom portion.

In such an embodiment, as the attachment pieces 125, 126, 127, and 128 are bent along the stepped shape of the open ground portion 132, a width of the slit 124 becomes greater, and a size of the width of the slit 124 may be determined when the attachment pieces 125, 126, 127, and 128 contact the bottom portion and are not bent any further.

Figure 5:
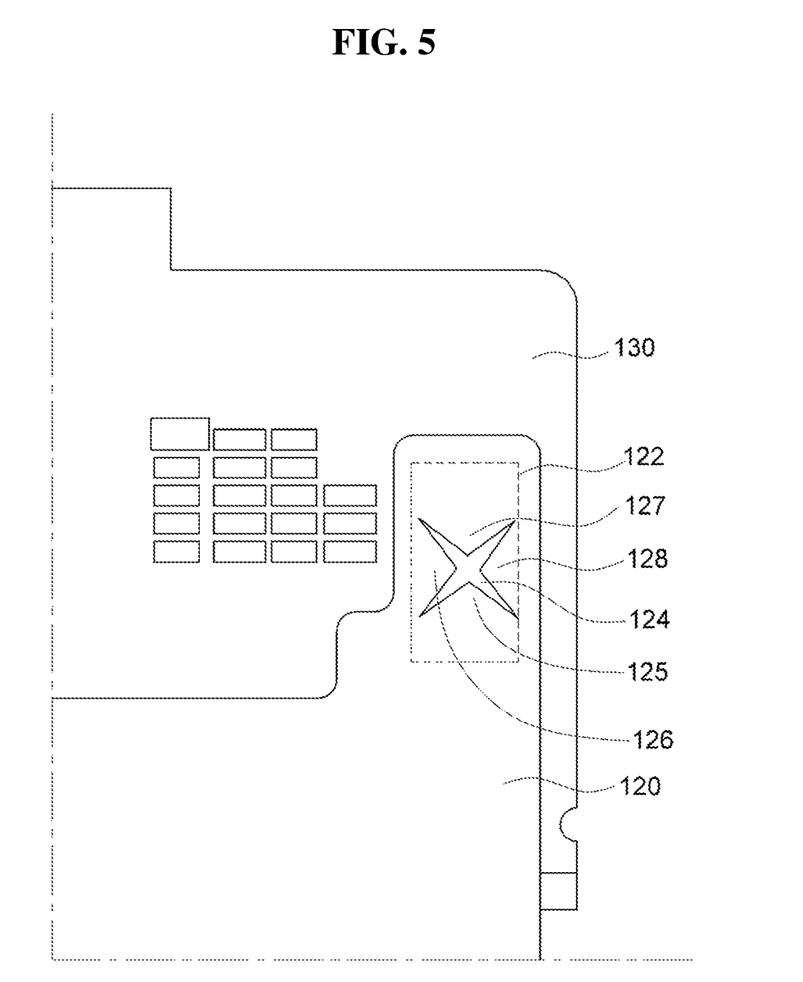
FIG. 5 is a view illustrating an embodiment in which a cut portion of an IC cover portion is cut in an X-like shape.
Figure 6:
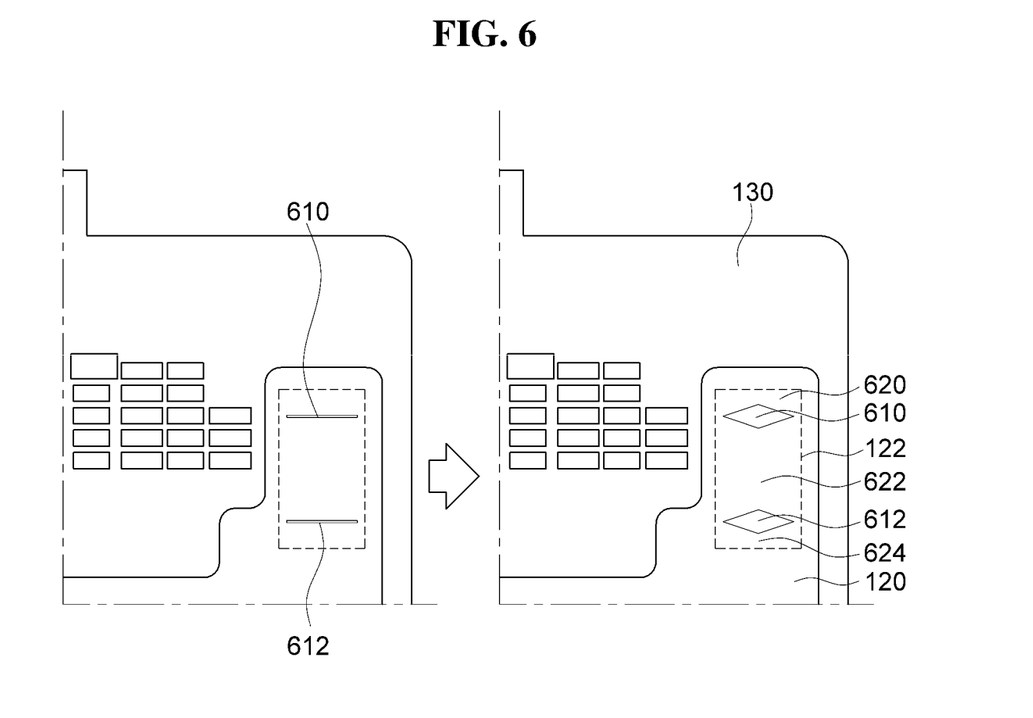
FIG. 6 is a view illustrating an embodiment in which a cut portion of an IC cover portion is cut in a horizontal direction at an upper portion and at a lower portion thereof.
Figure 7:
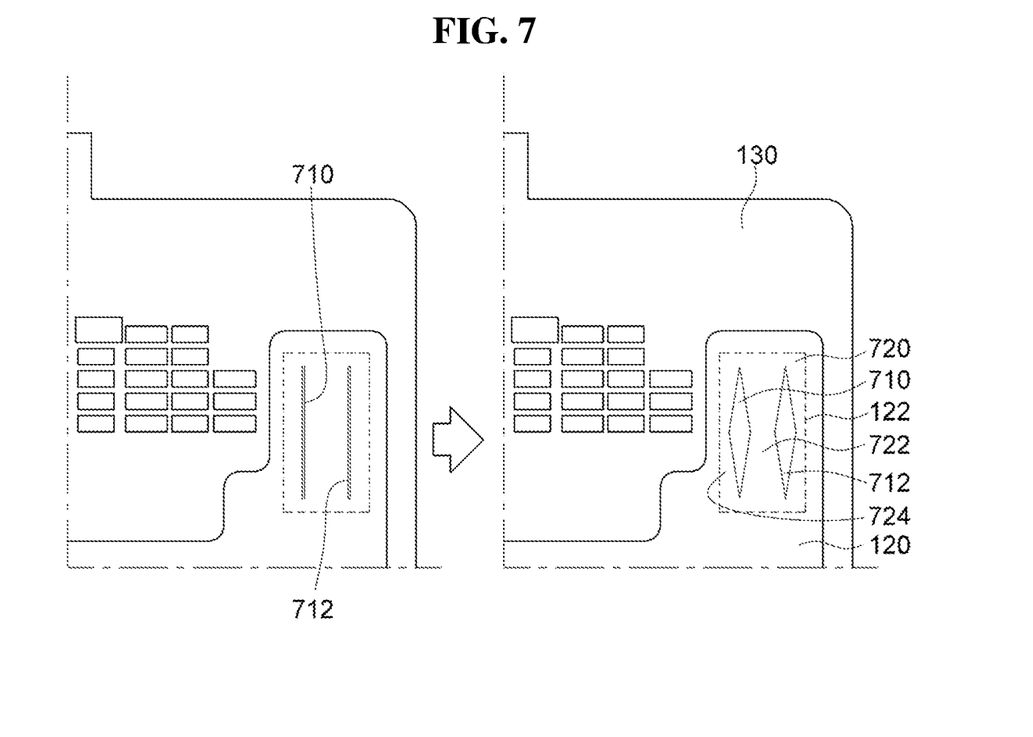
FIG. 7 is a view illustrating an embodiment in which a cut portion of an IC cover portion is cut in a vertical direction at a right portion and at a left portion thereof.
Figure 8:
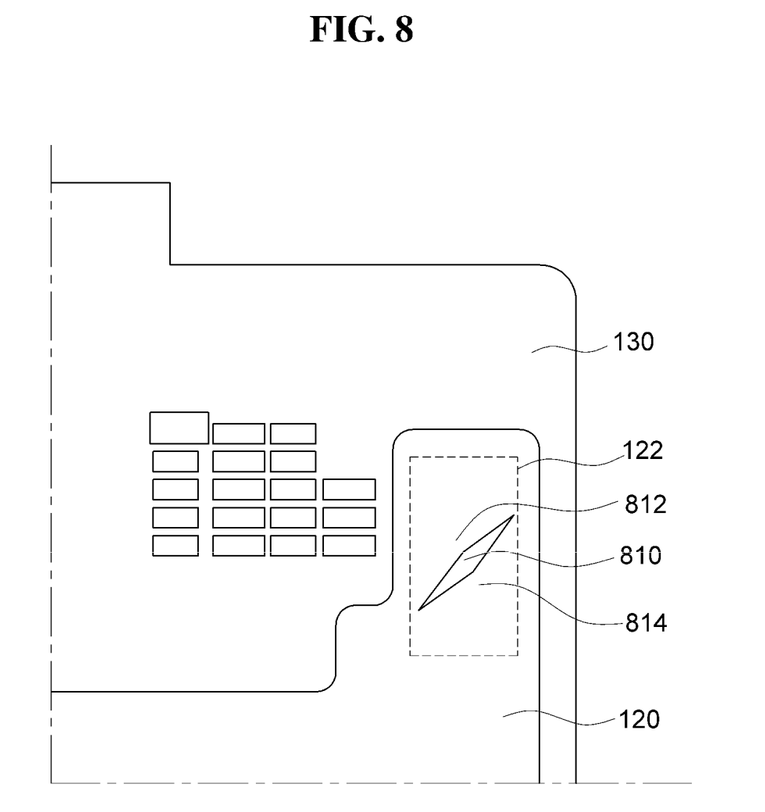
FIGS. 8 and 9 are views illustrating embodiments in which a cut portion of an IC cover portion is cut in a diagonal direction.
Figure 9:
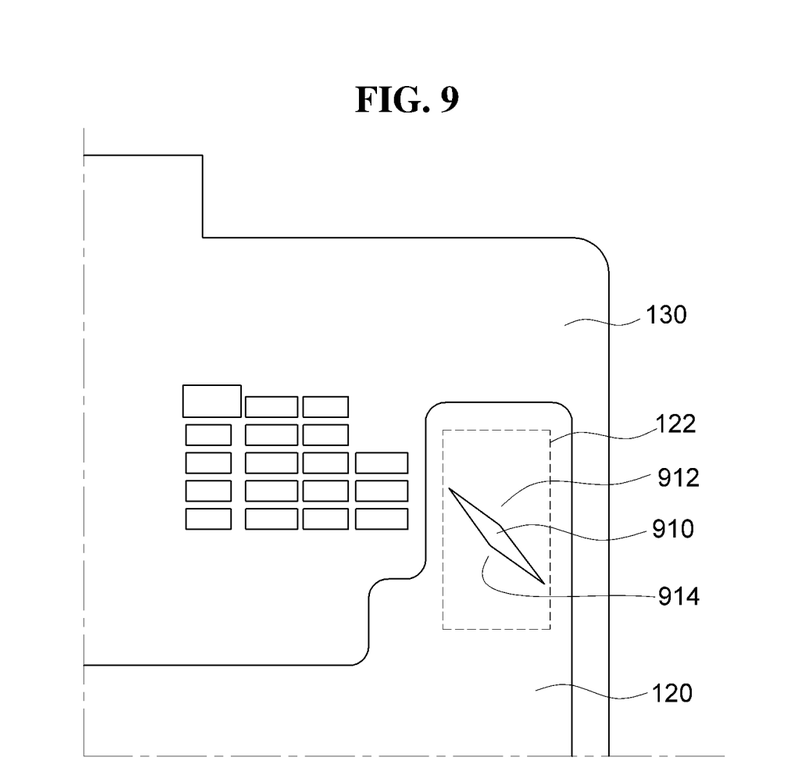

FIG. 5 is a view illustrating an embodiment in which a cut portion of an IC cover portion is cut in an X-like shape, FIG. 6 is a view illustrating an embodiment in which a cut portion of an IC cover portion is cut in a horizontal direction at an upper portion and at a lower portion thereof, FIG. 7 is a view illustrating an embodiment in which a cut portion of an IC cover portion is cut in a vertical direction at a right portion and at a left portion thereof, and FIGS. 8 and 9 are views illustrating embodiments in which a cut portion of an IC cover portion is cut in a diagonal direction.

Referring to FIG. 5, in a case where the cut portion 122 is cut in a cross shape or an X-like shape, the cut portion 122 may have a slit 124 in a cross shape or in an X-like shape.

For example, when the cut portion 122 is cut in an X-like shape, the cut portion 122 may have the slit 124 having an X-like shape, and may include a first attachment piece 125, a second attachment piece 126, a third attachment piece 127, and a fourth attachment piece 128, as may be defined by the slit 124. In such an embodiment, the attachment pieces 125, 126, 127, and 128 may have pointed ends.

In a plan view, the slit 124 may have a greater width toward a center portion of the open ground portion 132. That is, when the IC cover portion 120 is attached to the FPCB 130, the attachment pieces 125, 126, 127, and 128 of the cut portion 122 are bent toward the open ground portion 132 of the FPCB 130, and accordingly, a width of the slit 124 may increase (e.g., toward the center portion). In such an embodiment, the IC cover portion 120 may include a metallic material (e.g., Cu), which is not restored to its original state (e.g., unbent state) when the attachment pieces 125, 126, 127, and 128 are bent or curved.

As having a greater width in a plan view toward the center portion of the open ground portion 132, the slit 124 may expose a portion of the open ground portion 132 in a plan view through the increasing width.

In other embodiments, the slit may extend parallel to one side of the cut portion 122. In such an embodiment, the slit may include a first slit and a second slit that is parallel to the first slit.

Referring to FIG. 6, in a case where the cut portion 122 of the IC cover portion 120 is cut in a horizontal direction, in a direction parallel to a horizontal side of the cut portion 122, and at both of an upper portion and a lower portion of the cut portion 122, the cut portion 122 may have a first slit 610 and a second slit 612 corresponding to respective cuts in the horizontal direction at both of the upper portion and the lower portion of the cut portion 122.

That is, in a case where the cut portion 122 is cut in a "-" shape in a horizontal direction at both of an upper portion and a lower portion thereof, the cut portion may have a first slit 610 and a second slit 612 in a "-" shape in a horizontal direction, and may include a first attachment piece 620, a second attachment piece 622, and a third attachment piece 624 by the first slit 610 and the second slit 612.

When each of the attachment pieces 620, 622, and 624 of the cut portion 122 is bent toward the open ground portion 132 of the FPCB 130 when the IC cover portion 120 is attached to the FPCB 130, widths of the first slit 610 and the second slit 612 may gradually increase in a vertical direction (e.g., toward respective centers of the slits 610 and 612).

Subsequently, when each of the attachment pieces 620, 622, and 624 is bent toward the open ground portion 132 and comes into contact with a bottom portion of the open ground portion 132, the first slit 610 and the second slit 612 may expose portions of the open ground portion 132 through spaces of greater widths, which have increased from the initial widths when the slits 610 and 612 are initially created.

Referring to FIG. 7, in a case where the cut portion 122 of the IC cover portion 120 is cut in a vertical direction, in a direction parallel to a vertical side of the cut portion 122, and at both of a left portion and a right portion of the cut portion 122, the cut portion 122 may have a first slit 710 and a second slit 712 in a shape of being cut in the vertical direction at both of the left portion and the right portion of the cut portion 122.

That is, in a case where the cut portion 122 is cut in a "|" shape in a vertical direction at both of a left portion and a right portion thereof, the cut portion 122 may have a first slit 710 and a second slit 712 in a "|" shape in a vertical direction, and may include a first attachment piece 720, a second attachment piece 722, and a third attachment piece 724 by the first slit 710 and the second slit 712.

When each of the attachment pieces 720, 722, and 724 of the cut portion 122 is bent toward the open ground portion 132 of the FPCB 130 when the IC cover portion 120 is attached to the FPCB 130, widths of the first slit 710 and the second slit 712 may gradually increase in a horizontal direction (e.g. toward a center of each of the slits 710 and 712).

Subsequently, when each of the attachment pieces 720, 722, and 724 is bent toward the open ground portion 132 and comes into contact with a bottom portion of the open ground portion 132, the first slit 710 and the second slit 712 may expose portions of the open ground portion 132 through spaces of greater widths that have increased.

In other embodiments, the slit may extend in a diagonal direction of the cut portion 122.

Referring to FIG. 8, in a case where the cut portion 122 of the IC cover portion 120 is cut in a diagonal direction from an upper right portion to a lower left portion thereof, the cut portion 122 may have a slit 810 in a shape of being cut in the diagonal direction from the upper right portion (e.g., near the upper right portion) to the lower left portion (e.g., toward the lower left portion) of the cut portion 122.

That is, in a case where the cut portion 122 has the slit 810 that is cut in the diagonal direction from the upper right portion to the lower left portion of the cut portion 122, the cut portion 122 may include a first attachment piece 812 and a second attachment piece 814 (e.g., as separated by the slit 810).

When each of the attachment pieces 812 and 814 of the cut portion 122 is bent toward the open ground portion 132 of the FPCB 130 when the IC cover portion 120 is attached to the FPCB 130, a width of the slit 810 may gradually increase (e.g., toward a center thereof).

Subsequently, when each of the attachment pieces 812 and 814 is bent toward the open ground portion 132 and comes into contact with a bottom portion of the open ground portion 132, the slit 810 may expose, in a plan view, a portion of the open ground portion 132 through a space having increased width.

Referring to FIG. 9, in a case where the cut portion 122 of the IC cover portion 120 is cut in a diagonal direction from an upper left portion to a lower right portion thereof, the cut portion 122 may have a slit 910 in a shape of being cut in the diagonal direction from the upper left portion (e.g., near the upper left portion) to the lower right portion (e.g., toward the lower right portion) of the cut portion 122.

That is, in a case where the cut portion 122 has the slit 910 that is cut in the diagonal direction from the upper left portion to the lower right portion of the cut portion 122, the cut portion 122 may include a first attachment piece 912 and a second attachment piece 914 separated by the slit 910.

When each of the attachment pieces 912 and 914 of the cut portion 122 is bent toward the open ground portion 132 of the FPCB 130 when the IC cover portion 120 is attached to the FPCB 130, a width of the slit 910 may gradually increase.

Subsequently, when each of the attachment pieces 912 and 914 is bent toward the open ground portion 132 and comes into contact with a bottom portion of the open ground portion 132, the slit 910 may expose, in a plan view, a portion of the open ground portion 132 through a space of the greater width, which is increased toward a center thereof.

As illustrated in FIGS. 5, 6, 7, 8, and 9, the slits generated in the cut portion 122 of the IC cover portion 120 may have different widths in a plan view depending on the positions, sizes, and shapes of the respective attachment pieces.

In addition, as illustrated in FIG. 5, the slit 124 may have a greater width in a plan view toward the center portion of the open ground portion 132, in which case the attachment pieces 125, 126, 127, and 128 may have pointed ends.

In addition, as illustrated in FIGS. 5, 6, 7, 8, and 9, the slit may have a greater width in a plan view as each of the attachment pieces is bent toward the open ground portion, and the slit may expose a portion of the open ground portion 132 in a plan view through a space of the greater width.

As described above, the display device according to an embodiment has a structure in which the attachment pieces 125, 126, 127, and 128 of the IC cover portion 120 are bent and contact the open ground portion 132 of the FPCB 130 to be attached thereto when the IC cover portion 120 is attached to the driving IC 27 and to the FPCB 130, and such a structure may be applicable to mobile devices, such as a smart phone, a mobile phone, and a PDA.

Figure 10:
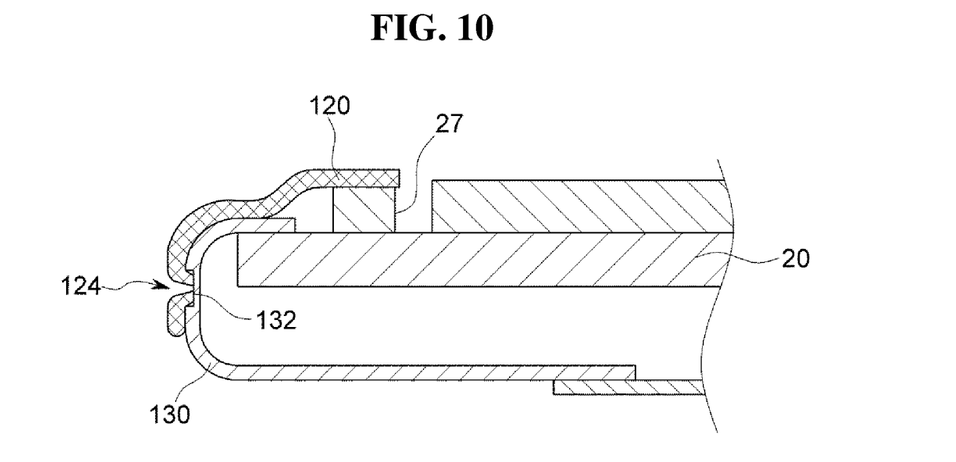
FIG. 10 is a cross-sectional view illustrating a structure in which an IC cover portion according to an embodiment is bent and attached to a driving IC and an FPCB.

FIG. 10 is a cross-sectional view illustrating a structure in which an IC cover portion according to an embodiment is bent and attached to a driving IC and an FPCB.

As illustrated in FIG. 10, the IC cover portion 120 may overlap the driving IC 27, may overlap a portion of the FPCB 130, and may be bent in a state of being attached to the driving IC 27 and the FPCB 130.

In such an embodiment, regardless of an elastic force of the FPCB 130, the attachment pieces 125, 126, 127, and 128 of the IC cover portion 120 may be bent while being kept in contact with a bottom portion of the open ground portion 132. In such an embodiment, a portion of the open ground portion 132 may be exposed through a space where the width of the slit 124 increases as the attachment pieces 125, 126, 127, and 128 are bent.

Figure 11:
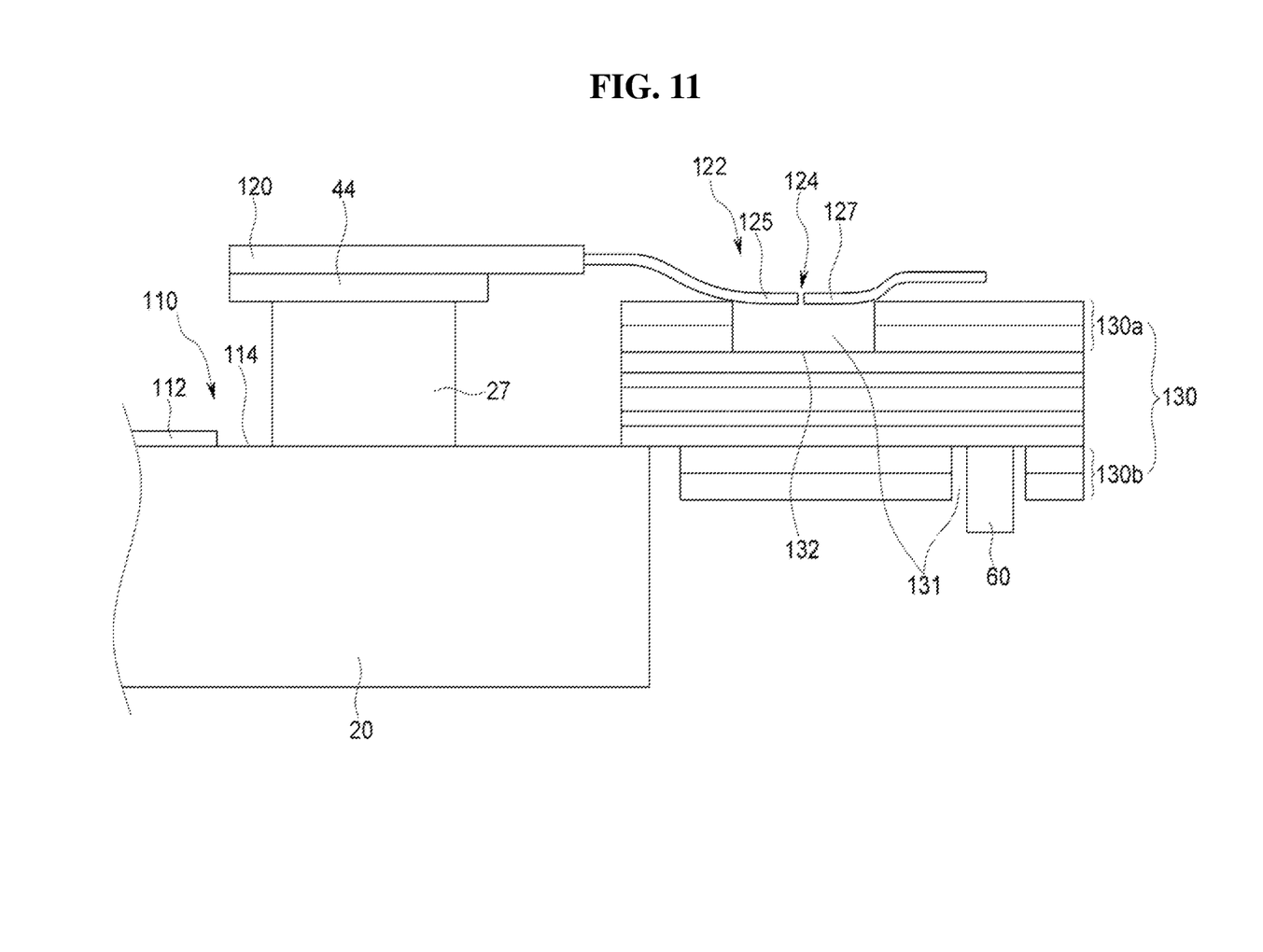
FIG. 11 is a cross-sectional view illustrating a structure of a display panel of a display device according to another embodiment.

FIG. 11 is a cross-sectional view illustrating a structure of a display panel of a display device according to another embodiment.

Referring to FIG. 11, a display device according to another embodiment includes a display panel 110 including a display area 112 and a non-display area 114, a driving IC 27 for providing signals, data, and voltages to the display area 112, and an FPCB 130 connected to the driving IC 27.

The FPCB 130 may include a plurality of wiring layers Cu, PI, and CU that are connected to the driving IC 27, and cover layers 130*a* and 130*b* that cover the plurality of wiring layers by at least one surface thereof. The cover layers 130*a* and 130*b* may have a plurality of opening depressions 131 that expose at least a portion of the plurality of wiring layers. An open ground portion 132 may be located in at least one of the plurality of opening depressions 131. The FPCB 130 may include a circuit element 60 located at another of the plurality of opening depressions 131.

The IC cover portion 120 overlaps the driving IC 27 and at least a portion of the FPCB 130 and may include a cut portion 122 that is located at an area corresponding to the open ground portion 132 and has at least one slit 124.

The cut portion 122 may include attachment pieces 125 and 127 that are bent on the cover layer 130*a* and contact the open ground portion 132. That is, at the cut portion 122 of the IC cover portion 120, the attachment pieces 125 and 127 may be bent on the cover layer 130*a* and attached to the open ground portion 132 to contact with the open ground portion 132. An adhesive resin may be further provided between the attachment pieces 125 and 127 and the open ground portion 132 for attachment.

When the IC cover portion 120 is attached to the driving IC 27 and the FPCB 130, a non-conductive tape 44 may be further provided between the IC cover portion 120 and the driving IC 27 for insulation with the driving IC 27.

A width of the slit 124 generated at the cut portion 122 of the IC cover portion 120 may increase as the attachment pieces 125 and 127 are bent, and the slit 124 may expose a portion of the open ground portion 132 of the FPCB 130 through a space of the width that has increased.

As illustrated in FIGS. 5, 6, 7, 8, and 9, the slits may have different widths depending on the positions of the respective attachment pieces. In addition, the slits may have different widths depending on the shapes and sizes of the respective attachment pieces.

In addition, as illustrated in FIG. 5, the slit 124 may have a greater width in a plan view toward a center portion of the open ground portion 132. That is, each slit may have a greater width toward a center portion of the open ground portion 132 as the attachment pieces are bent at the open ground portion 132 to contact a bottom portion of the open ground portion 132.

The FPCB 130 may include a circuit element 60 located at another of a plurality of opening depressions 131. The IC cover portion 120 may be attached on the FPCB 130 in a manner not overlapping (e.g., not entirely overlapping) the circuit element 60 located at the FPCB 130. Alternatively, the IC cover portion 120 may be attached on the FPCB 130 in a manner overlapping the circuit element 60 located at the FPCB 130.

As set forth hereinabove, according to one or more embodiments of the present disclosure, when the IC cover portion 120 is attached to the driving IC 27 and the FPCB 130, each of the attachment pieces (e.g., attachment pieces 125, 126, 127, and 128) contacts, and is attached to, a bottom portion of the open ground portion 132, and thus ESD due to the driving IC 27 may be substantially prevented.

In addition, according to one or more embodiments of the present disclosure, it is not necessary to additionally attach a conductive tape for complete contact when the IC cover portion 120 is attached to the driving IC 27 and the FPCB 130.

In addition, according to one or more embodiments of the present disclosure, even when the open area of the FPCB 130 is narrow, the attachment piece of the FPCB 130 is bent and attached to the bottom portion in the open area through the cut portion, and thus the contact efficiency may be improved regardless of the size of the open area.

In addition, according to one or more embodiments of the present disclosure, the attachment pieces are formed by the cut portion for the IC cover portion 120, and the attachment pieces are bent to contact the bottom portion of the open ground portion 132 such that the adhesion may be increased between the IC cover portion 120 and the ground.

In addition, according to one or more embodiments of the present disclosure, because the conductive tape is not additionally attached, manufacturing cost may be reduced.

As such, according to one or more embodiments of the present disclosure, a display device that is capable of preventing ESD of the driving IC, which provides signals, data, and voltages to the display area of the display panel, by attaching the IC cover portion to the driving IC and to the FPCB connected to the driving IC, may be realized.

While the present disclosure has been illustrated and described with reference to the embodiments thereof, it will be apparent to those of ordinary skill in the art that various changes in form and detail may be made thereto without departing from the spirit and scope of the present invention, and that functional equivalents of the claims are included therein.

What is claimed is:

1. A display device comprising:
   a display panel comprising a display area and a non-display area;

a driving integrated circuit for providing signals, data, and voltages to the display area;

a flexible printed circuit board coupled to the driving integrated circuit, and comprising an open ground portion at one side of the flexible printed circuit board; and an integrated circuit cover portion overlapping the driving integrated circuit and at least a portion of the flexible printed circuit board, and comprising a cut portion at an area corresponding to the open ground portion.

2. The display device of claim 1, wherein the cut portion comprises at least two attachment pieces that define a slit or opening.

3. The display device of claim 2, wherein at least one of the attachment pieces is bent and contacts the open ground portion.

4. The display device of claim 3, further comprising an adhesive resin between at least one of the attachment pieces and the open ground portion.

5. The display device of claim 3, wherein the slit or opening exposes a portion of the open ground portion in a plan view.

6. The display device of claim 2, wherein the slit or opening has a different width in a plan view according to a relation to a position of at least one of the attachment pieces.

7. The display device of claim 2, wherein the slit or opening has a greater width toward a center portion of the open ground portion in a plan view.

8. The display device of claim 7, wherein at least one of the attachment pieces has a pointed end.

9. The display device of claim 2, wherein the slit or opening has an X-like shape or a cross-shape.

10. The display device of claim 2, wherein the slit or opening extends substantially parallel to one side of the cut portion.

11. The display device of claim 10, wherein the slit or opening comprises a first slit or opening, and a second slit or opening that is parallel to the first slit or opening.

12. The display device of claim 2, wherein the slit or opening extends in a diagonal direction of the cut portion.

13. The display device of claim 1, wherein the integrated circuit cover portion does not overlap elements at the flexible printed circuit board.

14. The display device of claim 1, wherein the integrated circuit cover portion overlaps elements at the flexible printed circuit board.

15. The display device of claim 1, further comprising a non-conductive tape between the integrated circuit cover portion and the driving integrated circuit.

16. The display device of claim 15, wherein the non-conductive tape comprises an adhesive resin at opposite sides thereof.

17. The display device of claim 1, wherein the driving integrated circuit is at the non-display area of the display panel.

18. A display device comprising:

a display panel comprising a display area and a non-display area;

a driving integrated circuit for providing signals, data, and voltages to the display area;

a flexible printed circuit board comprising a plurality of wiring layers that are coupled to the driving integrated circuit, and a cover layer that at least partially covers the plurality of wiring layers, and that defines a plurality of opening depressions exposing at least a portion of the plurality of wiring layers, at least one of the plurality of opening depressions comprising an open ground portion; and an integrated circuit cover portion overlapping the driving integrated circuit and at least a portion of the flexible printed circuit board, and comprising a cut portion that is at an area corresponding to the open ground portion and that defines at least one slit or opening.

19. The display device of claim 18, wherein the cut portion comprises an attachment piece that is bent at the cover layer and that contacts the open ground portion.

20. The display device of claim 19, further comprising an adhesive resin between the attachment piece and the open ground portion.

21. The display device of claim 19, wherein the slit or opening has a different width according to a relation to a position of the attachment piece.

22. The display device of claim 19, wherein the slit or opening has a greater width toward a center portion of the open ground portion.

23. The display device of claim 18, wherein the slit or opening exposes a portion of the open ground portion of the flexible printed circuit board.

24. The display device of claim 18, further comprising a non-conductive tape between the integrated circuit cover portion and the driving integrated circuit.

25. The display device of claim 18, wherein the flexible printed circuit board comprises an element at another of the plurality of opening depressions.

* * * * *